(12) United States Patent
McCollum

(10) Patent No.: US 9,325,321 B2
(45) Date of Patent: Apr. 26, 2016

(54) BACKGROUND AUTO-REFRESH APPARATUS AND METHOD FOR NON-VOLATILE MEMORY ARRAY

(71) Applicant: Microsemi SoC Corporation, San Jose, CA (US)

(72) Inventor: John McCollum, San Jose, CA (US)

(73) Assignee: Microsemi SoC Corporation, San Jose, CA (US)

( * ) Notice: Subject to any disclaimer, the term of this patent is extended or adjusted under 35 U.S.C. 154(b) by 83 days.

(21) Appl. No.: 14/208,513

(22) Filed: Mar. 13, 2014

(65) Prior Publication Data

US 2014/0269133 A1    Sep. 18, 2014

Related U.S. Application Data

(60) Provisional application No. 61/778,901, filed on Mar. 13, 2013.

(51) Int. Cl.
  *G11C 7/00* (2006.01)
  *H03K 19/177* (2006.01)
  *G11C 16/34* (2006.01)
  *G11C 11/23* (2006.01)

(52) U.S. Cl.
  CPC ........ *H03K 19/1776* (2013.01); *G11C 16/3431* (2013.01); *G11C 11/23* (2013.01)

(58) Field of Classification Search
  CPC ......... G11C 11/23; G11C 13/048; G11B 9/10

USPC .......... 365/218, 222, 230.08, 185.25, 185.21, 365/230.05
  See application file for complete search history.

(56) References Cited

U.S. PATENT DOCUMENTS

| | | | | |
|---|---|---|---|---|
| 5,909,449 | A * | 6/1999 | So et al. .................. | 714/721 |
| 2005/0135155 | A1* | 6/2005 | Ishimaru et al. ......... | 365/185.25 |
| 2009/0161466 | A1* | 6/2009 | Hamilton et al. ........ | 365/222 |
| 2013/0145082 | A1* | 6/2013 | Tamagawa ............... | 711/103 |
| 2014/0078830 | A1* | 3/2014 | McCollum ............... | 365/185.21 |

* cited by examiner

*Primary Examiner* — Connie Yoha
(74) *Attorney, Agent, or Firm* — Leech Tishman Fuscaldo & Lampl; Kenneth D'Alessandro, Esq.

(57) ABSTRACT

A method for automatically refreshing a non-volatile memory array in the background without memory interruption includes selecting an unrefreshed segment of the memory, reading data from each row in the selected segment during memory dead time and storing the data read from each row in a local temporary storage memory until an entire segment is read out, remapping all memory addresses in the selected segment to the temporary storage memory, isolating column lines in the selected segment from global column lines, erasing the data in the selected segment without disturbing the column lines, rewriting memory data in each row of the selected segment, remapping all memory addresses in the selected segment to the memory, and repeating the process until all segments have been refreshed.

8 Claims, 3 Drawing Sheets

BACKGROUND AUTO-REFRESH APPARATUS AND METHOD FOR NON-VOLATILE MEMORY ARRAY

CROSS REFERENCE TO RELATED APPLICATION

This application claims the benefits of U.S. Provisional Patent Application No. 61/778,901, filed Mar. 13, 2013, and titled "Background Autorefresh Apparatus and Method for Non-Volatile Memory Array", which application is incorporated herein by reference in its entirety.

BACKGROUND OF THE INVENTION

1. Field of the Invention

The present invention relates to integrated circuits and to integrated circuit non-volatile memory arrays. More particularly, the present invention relates to background auto-refresh techniques for non-volatile memory arrays for programmable logic devices, such as field programmable gate array (FPGA) integrated circuits.

2. Description of Related Art

Non-volatile memories have typical lifetimes in excess of ten years. Therefore there is no need to refresh the memories. This is commonly done in dynamic random access memories (DRAMs) as the memory is stored in capacitors in silicon which slowly leaks, requiring the memory to be refreshed every few milliseconds. Most eNVMs store charge in dielectrics that have leakages that are so low that the charge is retained for many years.

With the current trend towards extreme submicron scaling, the memory cell dielectrics are becoming thin enough that charge leakage is becoming an issue, particularly at high temperatures (125° C.).

It would be advantageous to periodically refresh eNVMs that cannot retain their charge for 10 years at 125° C. to be refreshed periodically. There are two issues with such periodic refresh. One is to determine when to refresh. The second is that refresh is performed under user or system control, thus the initiation is determined by the system such that either no access is attempted during the time the eNVM is being refreshed, or the eNVM can be refreshed in the background, such that the system is never aware that it is being done. This presents some difficulties that need to be addressed. Write times are on the order of milliseconds so, if the memory is to be refreshed in the background, an alternate memory must be used during refresh. In addition, any loss of power during refresh cannot be allowed to cause any loss of data.

SUMMARY OF THE INVENTION

According to one aspect of the present invention, a method for automatically refreshing a non-volatile memory array in the background without memory interruption includes selecting an unrefreshed segment of the non-volatile memory, reading data from each row in the selected segment, and storing the data read from each row in a local temporary storage memory, such as a static random access memory (SRAM) block until an entire segment is read out, remapping all memory addresses in the selected segment to the temporary storage memory, isolating column lines in the selected segment from global column lines of the non-volatile memory array, erasing the data in the selected segment, rewriting memory data in each row of the selected segment, remapping all memory addresses in the selected segment to the non-volatile memory, and repeating the process until all segments have been refreshed. The method may commence in response to receiving a memory refresh signal before selecting an unrefreshed segment of the non-volatile memory. The reading data from each row in the selected segment and storing the data read from each row in a temporary storage memory block until an entire segment is read out may be performed during memory dead time.

According to another aspect of the present invention, an apparatus for automatically refreshing a non-volatile memory array in the background without memory interruption includes a set of output bit lines coupled to the memory array, a dead-time detection circuit for detecting when no memory access requests are pending, a temporary storage circuit coupled to the memory array and to the set of output bit lines for temporarily storing data from a selected group of rows in the memory array, a circuit responsive to a memory refresh signal request including a selection circuit for selecting a selected group of rows in the memory array, a circuit responsive to the dead-time circuit for reading data from the selected group of rows and writing the data into the temporary storage circuit in the memory array, a circuit for re-mapping addresses of the data from the selected group of rows during refresh to addresses in the temporary storage circuit containing the data and for re-mapping addresses of the data after refresh from the selected group of rows back to addresses in the memory array, and a circuit for erasing and re-programming the selected group of rows of the memory array. The apparatus may be enabled in response to receiving a memory refresh signal.

BRIEF DESCRIPTION OF THE DRAWINGS

Additional advantages and details of the invention are explained below with reference to the exemplary embodiments illustrated in the accompanying schematic figures, in which like reference numbers identify like parts throughout.

DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
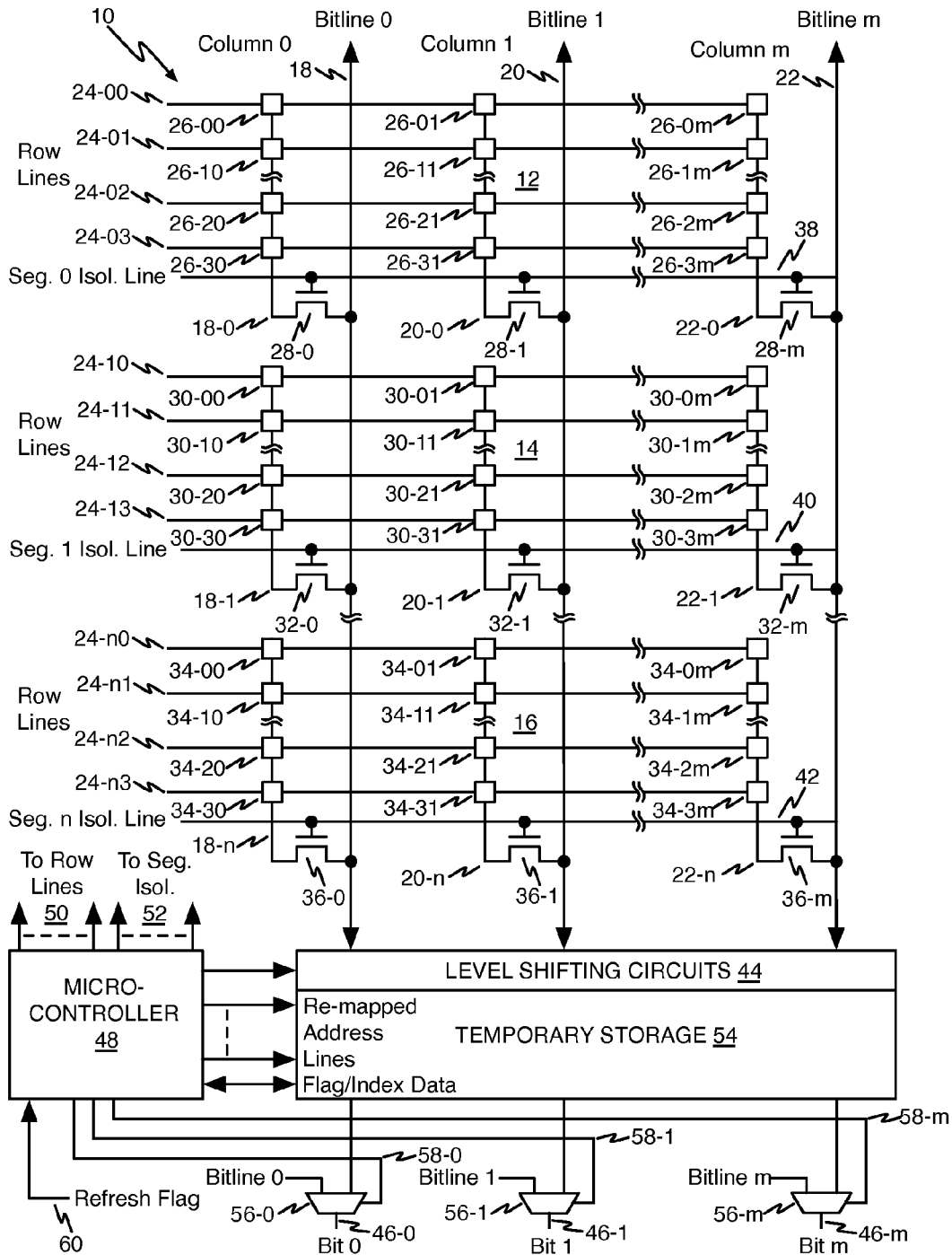
FIG. 1 is a block diagram showing illustrative circuitry for implementing background auto-refresh on a non-volatile memory according to one aspect of the present invention.

Referring now to FIG. 1, a block diagram shows illustrative circuitry for implementing background auto-refresh on a non-volatile memory array according to one aspect of the present invention. Memory circuit 10 is shown divided into multiple segments 12, 14, and 16. While three segments are shown in the illustration of FIG. 1, persons of ordinary skill in the art will appreciate that the present invention may be applied to memory arrays of arbitrary size.

The memory array depicted in FIG. 1 includes m columns divided into n segments. For the purposes of illustrating the invention, each of the n segments is shown having four rows, but persons of ordinary skill in the art will appreciate that actual implementations of the invention will include a larger number of rows per segment.

The memory array includes a plurality of column lines and a plurality of row lines. Column line 18 is associated with column 0 of the array; column line 20 is associated with column 1 of the array; and column line 22 is associated with column m of the array.

Row line 24-00 is associated with the first row of segment 0 of the memory array. Row line 24-01 is associated with the second row of segment 0 of the memory array. Row line 24-02 is associated with the third row of segment 0 of the memory array. Row line 24-03 is associated with the fourth row of segment 0 of the memory array. Row line 24-10 is associated with the first row of segment 1 of the memory array. Row line 24-11 is associated with the second row of segment 1 of the memory array. Row line 24-12 is associated with the third row of segment 1 of the memory array. Row line 24-13 is associated with the fourth row of segment 1 of the memory array. Row line 24-$n$0 is associated with the first row of segment n of the memory array. Row line 24-$n$1 is associated with the second row of segment n of the memory array. Row line 24-$n$2 is associated with the third row of segment n of the memory array. Row line 24-$n$3 is associated with the fourth row of segment n of the memory array.

A non-volatile memory cell is disposed at each row and column position in the array. Memory cells 26-00, 26-01, and 26-0$m$ are in a first row of segment 0 of the array and are coupled to row line 24-00. Memory cells 26-10, 26-11, and 26-1$m$ are in a second row of segment 0 of the array and are coupled to row line 24-10. Memory cells 26-20, 26-21, and 26-2$m$ are in a third row of segment 0 of the array and are coupled to row line 24-02. Memory cells 26-30, 26-31, and 26-3$m$ are in a fourth row of segment 0 of the array and are coupled to row line 24-03.

Memory cells 26-00, 26-10, 26-20, and 26-30 are coupled to column line segment 18-0. Column line segment 18-0 is coupled to column line 18 through segment isolation transistor 28-0. Memory cells 26-01, 26-11, 26-21, and 26-31 are coupled to column line segment 20-0. Column line segment 20-0 is coupled to column line 20 through segment isolation transistor 28-1. Memory cells 26-0$m$, 26-1$m$, 26-2$m$, and 26-3$m$ are coupled to column line segment 22-0. Column line segment 22-0 is coupled to column line 22 through segment isolation transistor 28-$m$.

Memory cells 30-00, 30-01, and 30-0$m$ are in a first row of segment 1 of the array and are coupled to row line 24-10. Memory cells 30-10, 30-11, and 30-1$m$ are in a second row of segment 1 of the array and are coupled to row line 24-11. Memory cells 30-20, 30-21, and 30-2$m$ are in a third row of segment 1 of the array and are coupled to row line 24-12. Memory cells 30-30, 30-31, and 30-3$m$ are in a fourth row of segment 1 of the array and are coupled to row line 24-13.

Memory cells 30-00, 30-10, 30-20, and 30-30 are coupled to column line segment 18-1. Column line segment 18-1 is coupled to column line 18 through segment isolation transistor 32-0. Memory cells 30-01, 30-11, 30-21, and 30-31 are coupled to column line segment 20-1. Column line segment 20-1 is coupled to column line 20 through segment isolation transistor 32-1. Memory cells 30-0$m$, 30-1$m$, 30-2$m$, and 30-3$m$ are coupled to column line segment 22-1. Column line segment 22-1 is coupled to column line 22 through segment isolation transistor 32-$m$.

Memory cells 34-00, 34-01, and 34-0$m$ are in a first row of segment n of the array and are coupled to row line 24-$n$0. Memory cells 34-10, 34-11, and 34-1$m$ are in a second row of segment n of the array and are coupled to row line 24-$n$1. Memory cells 34-20, 34-21, and 34-2$m$ are in a third row of segment n of the array and are coupled to row line 24-$n$2. Memory cells 34-30, 34-31, and 34-3$m$ are in a fourth row of segment n of the array and are coupled to row line 24-$n$3.

Memory cells 34-00, 34-10, 34-20, and 34-30 are coupled to column line segment 18-$n$. Column line segment 18-$n$ is coupled to column line 18 through segment isolation transistor 36-0. Memory cells 34-01, 34-11, 34-21, and 34-31 are coupled to column line segment 20-$n$. Column line segment 20-$n$ is coupled to column line 20 through segment isolation transistor 36-1. Memory cells 34-0$m$, 34-1$m$, 34-2$m$, and 34-3$m$ are coupled to column line segment 22-$n$. Column line segment 22-$n$ is coupled to column line 22 through segment isolation transistor 36-$m$.

The gates of segment isolation transistors 28-0, 28-1, and 28-$m$ are coupled to segment isolation line 0 at reference numeral 38. The gates of segment isolation transistors 32-0, 32-1, and 32-$m$ are coupled to segment isolation line 1 at reference numeral 40. The gates of segment isolation transistors 36-0, 36-1, and 36-$m$ are coupled to segment isolation line n at reference numeral 42.

In a typical prior art memory array, column lines 18, 20, and 22 would be coupled through level shifting circuit 44 to Bit-0 output 46-0, Bit-1 output 46-1, and Bit-m output 46-$m$, respectively. The purpose of level shifting circuit 44 is to provide the proper voltage levels for erasing and programming the memory cells in the array during program and erase operations, and otherwise passing the memory cell output levels to Bit-0 output 46-0, Bit-1 output 46-1, and Bit-m output 46-$m$, respectively. A microcontroller 48 or other on-chip controller or state machine controls the operation of level shifting circuits and, via lines 50 and 52, controls the signals placed on the row lines and segment isolation transistors as is known in the art.

In accordance with the present invention, temporary storage 54 is used to implement the background auto-refresh apparatus and method according to the present invention. Instead of providing the memory array data from column lines 18, 20, and 22 to Bit-0 output 46-0, Bit-1 output 46-1, and Bit-m output 46-$m$, respectively, the present invention routes Bitlines 0, 1, and m through multiplexers 56-0, 56-1, and 56-$m$, respectively. During normal operation of the memory, microcontroller 48 drives the select inputs of multiplexers 56-0, 56-1, and 56-$m$ via multiplexer select lines 58-0, 58-1, and 58-$m$ to pass the data on column lines 18, 20, and 22 to Bit-0 output 46-0, Bit-1 output 46-1, and Bit-m output 46-$m$, respectively. When a decision is made to refresh a segment of the memory array (as illustrated by refresh flag 60 provided to microcontroller 48), the contents of the memory cells in the segment are written into temporary storage 54.

Temporary storage 54 may comprise SRAM memory or other types of memory, such as non-volatile memory (NVM). The microcontroller 48 then re-maps the addresses intended for the memory segment to be refreshed into locations in the temporary storage 54 that hold the data written from the segment to be refreshed. One advantage of employing non-volatile memory for the temporary storage 54 is that it facilitates recovery if power is lost during the refresh procedure, since it can be used to store flags or indexes for the microcontroller to use during recovery to know where to resume the refresh procedure. FIG. 1 shows a flag/index data bus connected between the microcontroller 48 and the temporary storage 54 for use in such a refresh procedure recovery. The microcontroller 48 writes to a flag/index storage location in temporary storage 54, the address of the last data successfully written from the memory segment to be refreshed. In the event of power failure, after power is resumed, microcontroller 48 can access this address data from temporary storage 54 to determine where to continue the refresh procedure.

During the auto-refresh period, data from segments of the memory array other than the segment being refreshed is routed onto column lines 18, 20, and 22, and passed through multiplexers 56-0, 56-1, and 56-*m*, respectively, to Bit-0 output 46-0, Bit-1 output 46-1, and Bit-m output 46-*m*, respectively. When a memory address within the segment being refreshed is presented to the memory array, microcontroller 48 re-maps the address to temporary storage 54 and drives the select inputs of multiplexers 56-0, 56-1, and 56-*m* to pass the data from temporary storage 54 that corresponds to the data requested from the memory array to Bit-0 output 46-0, Bit-1 output 46-1, and Bit-m output 46-*m*, respectively.

Once the data from the memory array segment selected for refreshing has been written into temporary storage 54, the microcontroller 48 can then proceed to refresh the data in the memory array segment selected for refreshing. Memory refresh procedures for the various non-volatile memory cell types are well known to persons of ordinary skill in the art and will, therefore, not be discussed herein in order to avoid needlessly overcomplicating the disclosure.

Figure 2:
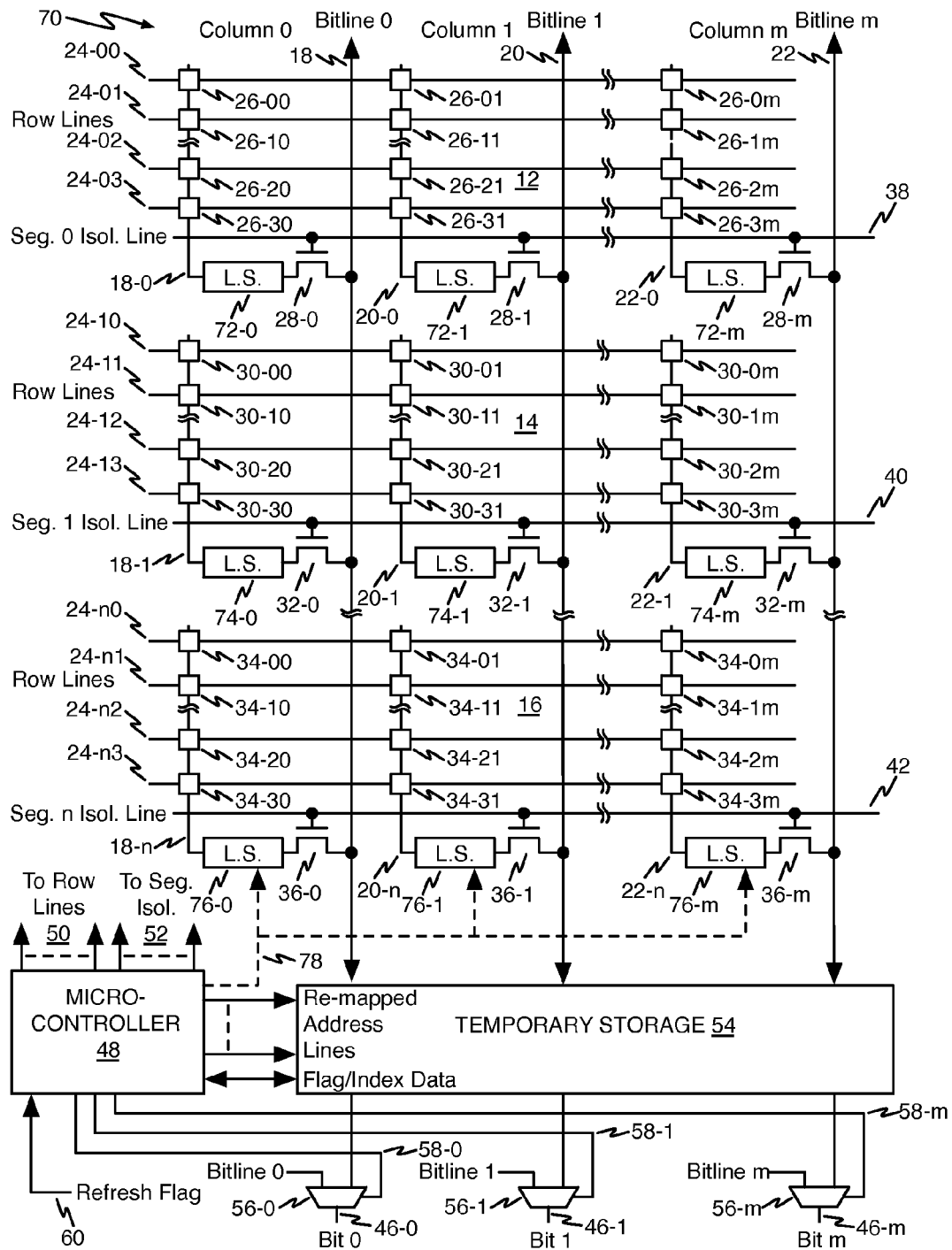
FIG. 2 is a block diagram showing illustrative circuitry for implementing background auto-refresh on a non-volatile memory according to another aspect of the present invention.

Referring now to FIG. 2, a block diagram shows illustrative circuitry 70 for implementing background auto-refresh on a non-volatile memory according to another aspect of the present invention. Many of the elements in the embodiment shown in FIG. 2 are the same as corresponding elements in the embodiment of FIG. 1. Accordingly, these elements will be identified using the same reference numerals used for the corresponding elements of FIG. 1.

From an examination of FIG. 2, it can be seen that, in place of level shifter circuit 44 of FIG. 1 between the memory array and the temporary storage 54, level shifter circuit 72-0 is placed between column line segment 18-0 and segment isolation transistor 28-0. Level shifter circuit 72-1 is placed between column line segment 20-0 and segment isolation transistor 28-1. Level shifter circuit 72-*m* is placed between column line segment 22-0 and segment isolation transistor 28-*m*. Similarly, level shifter circuit 74-0 is placed between column line segment 18-1 and segment isolation transistor 32-0; level shifter circuit 74-1 is placed between column line segment 20-1 and segment isolation transistor 32-1; level shifter circuit 74-*m* is placed between column line segment 22-1 and segment isolation transistor 32-*m*; level shifter circuit 76-0 is placed between column line segment 18-*n* and segment isolation transistor 36-0; level shifter circuit 76-1 is placed between column line segment 20-*n* and segment isolation transistor 36-1; and level shifter circuit 76-*m* is placed between column line segment 22-*n* and segment isolation transistor 36-*m*.

Individual level shifter circuits 72-0, 72-1, 72-*m*, 74-0, 74-1, 74-*m*, 76-0, 76-1, and 76-*m* are controlled from microcontroller 48 on lines 78. Control lines 78 are shown as dashed lines coupled to level shifter circuits 76-0, 76-1, and 76-*m*, although persons of ordinary skill in the art will appreciate that similar control lines (not shown to avoid overcomplicating the drawing figure) are coupled from microcontroller 48 to individual level shifter circuits 72-0, 72-1, 72-*m*, 74-0, 74-1, and 74-*m*.

Persons of ordinary skill in the art will observe that one advantage of employing individual level shifter circuits 72-0, 72-1, 72-*m*, 74-0, 74-1, 74-*m*, 76-0, 76-1, and 76-*m* is that the high voltages and times that are required to write many non-volatile memories would make global bitlines unusable during the write cycle and, therefore, make the other segments unusable for extended times. By providing a local level shifter, the data is written in a few nanoseconds and then the global bitline is available to the rest of the memory while the local level shifter does the extended write pulse.

The present invention is particularly suited for synchronous memories as used in embedded designs, but persons of ordinary skill in the art will appreciate that it can be applied to other memory arrays. The method of the present invention is particularly advantageous because it makes possible automatically refreshing a memory in the background without interruption of the ability to read and use memory data.

According to the present invention, memory data is read a row at a time, a process that takes nanoseconds, during dead time. The data is stored in a local SRAM block until an entire segment is read out. The row/column decoder is re-routed to the SRAM block so all memory read operations can continue unabated. The eNVM segment that was stored in the SRAM is then erased without disturbing the column lines by using a latch in the segment and keeping the segment isolated from the global column lines. The latches are loaded for each succeeding row in the segment in the refresh segment (a process which takes only nanoseconds) through the column lines during dead time. Each row is then re-written using the latch and the process moves to the next row. When the refresh of the segment is finished, the row/column addresses are redirected to the refreshed segment from the SRAM. Other blocks are refreshed until all blocks have been refreshed. The method of the present invention is controlled by microcontroller 48 running software or firmware. Persons of ordinary skill in the art will appreciate that such software or firmware may easily be written using a knowledge of the disclosure herein.

Figure 3:
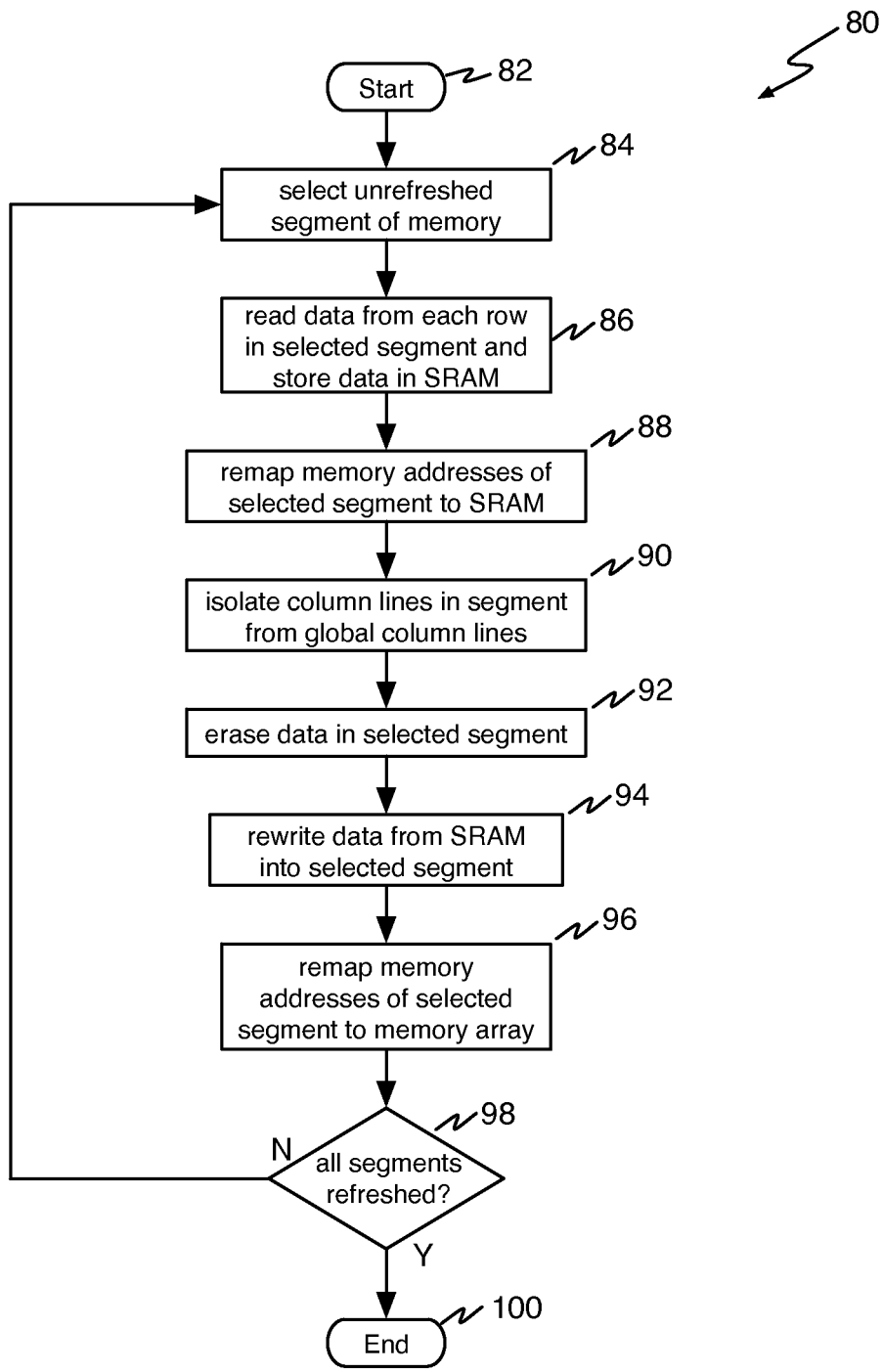
FIG. 3 is a flow diagram showing an illustrative method for implementing background auto-refresh on a non-volatile memory according to the present invention.

Referring now to FIG. 3, a flow diagram shows an illustrative method 80 for implementing background auto-refresh on a non-volatile memory according to the present invention. The process begins at reference numeral 82. At reference numeral 84, an unrefreshed segment of the memory is selected. At reference numeral 86, data is read from each row of the selected segment during memory dead time when no memory accesses are pending. The data is stored in temporary storage, such as SRAM.

When all of the rows in the selected segment have been read and stored in temporary storage, at reference numeral 88, the memory addresses of the selected segment are re-mapped into the SRAM so that the data can be accessed. At reference numeral 90, the column lines of the memory are isolated from the global column lines. At reference numeral 92, the data in the selected segment is erased. At reference numeral 94, the data is rewritten from the temporary storage back into the memory array segment. At reference numeral 96, the memory addresses of the selected segment are re-mapped into the memory array so that the data can again be accessed from the non-volatile memory array.

At reference numeral 98, it is determined whether all segments in the memory to be refreshed have been refreshed. If not, the process returns to reference numeral 84 where another segment to be refreshed is selected. If all of the segments in the memory have been refreshed, the process ends at reference numeral 100.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

The invention claimed is:

1. A method for automatically refreshing a non-volatile memory array in the background without memory interruption, comprising:

a) selecting an unrefreshed segment of the non-volatile memory;
b) reading data from each row in the selected segment, and storing the data read from each row in a local temporary storage memory until an entire segment is read out;
c) remapping all memory addresses in the selected segment to the local temporary storage memory;
d) isolating column lines in the selected segment from global column lines of the non-volatile memory array;
e) erasing the data in the selected segment;
f) rewriting memory data in each row of the selected segment;
g) remapping all memory addresses in the selected segment to the non-volatile memory;
h) writing to a flag/index storage location the address of the last data successfully rewritten; and
repeating a) through h) until all segments have been refreshed.

2. The method of claim 1, further including receiving a memory refresh signal before selecting an unrefreshed segment of the non-volatile memory.

3. The method of claim 1 wherein, reading data from each row in the selected segment, and storing the data read from each row in a local temporary storage memory until an entire segment is read out is performed during memory dead time.

4. The method of claim 1 wherein storing the data read from each row in a local temporary storage memory comprises storing the data read from each row in a local static read only memory (SRAM) block.

5. The method of claim 1 wherein storing the data read from each row in a local temporary storage memory comprises storing the data read from each row in a local non-volatile memory block.

6. Apparatus for automatically refreshing a non-volatile memory array in the background without memory interruption, comprising:
a set of output bit lines coupled to the memory array;
a dead-time detection circuit for detecting when no memory access requests are pending;
a temporary storage circuit coupled to the memory array and to the set of output bit lines for temporarily storing data from a selected group of rows in the memory array;
a circuit responsive to a memory refresh signal request including a selection circuit for selecting a selected group of rows in the memory array;
a circuit responsive to the dead-time circuit for reading data from the selected group of rows and writing the data into the temporary storage circuit the memory array;
a circuit for re-mapping addresses of the data from the selected group of rows during refresh to addresses in the temporary storage circuit containing the data and for re-mapping addresses of the data after refresh from the selected group of rows back to addresses in the memory array;
a circuit for writing to a flag/index storage location the address of the last data successfully rewritten; and
a circuit for erasing and re-programming the selected group of rows of the memory array.

7. The apparatus of claim 6 wherein the temporary storage circuit is a static read only memory (SRAM) block.

8. The apparatus of claim 6 wherein the temporary storage circuit is a non-volatile memory block.

* * * * *